(12) United States Patent
He

(10) Patent No.: US 11,087,827 B1
(45) Date of Patent: Aug. 10, 2021

(54) EDGE MEMORY ARRAY MATS WITH SENSE AMPLIFIERS

(71) Applicant: Micron Technology, Inc., Boise, ID (US)

(72) Inventor: Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/785,179

(22) Filed: Feb. 7, 2020

(51) Int. Cl.
*G11C 7/02* (2006.01)
*G11C 11/4091* (2006.01)
*H01L 27/108* (2006.01)
*G11C 11/4074* (2006.01)

(52) U.S. Cl.
CPC ...... *G11C 11/4091* (2013.01); *G11C 11/4074* (2013.01); *H01L 27/10894* (2013.01)

(58) Field of Classification Search
CPC ... G11C 11/4091; G11C 11/409; G11C 7/065; G11C 11/4063; G11C 11/413; H01L 27/10894
See application file for complete search history.

(56) References Cited

U.S. PATENT DOCUMENTS

| | | | | |
|---|---|---|---|---|
| 4,903,344 | A * | 2/1990 | Inoue | G11C 7/18 365/51 |
| 5,134,588 | A * | 7/1992 | Kubota | G11C 13/00 365/207 |
| 9,159,400 | B2 | 10/2015 | Ferrant et al. | |
| 9,767,919 | B1 * | 9/2017 | He | G11C 29/18 |
| 2002/0131289 | A1 * | 9/2002 | Thompson | G11C 5/025 365/51 |
| 2002/0167852 | A1 * | 11/2002 | Cowles | G11C 11/4074 365/201 |
| 2012/0044734 | A1 | 2/2012 | Lee et al. | |
| 2019/0214057 | A1 | 7/2019 | Won et al. | |

OTHER PUBLICATIONS

ISR/WO dated May 24, 2021 for PCT Application No. PCT/US2021/016453.

* cited by examiner

*Primary Examiner* — Uyen Smet
(74) *Attorney, Agent, or Firm* — Dorsey & Whitney LLP

(57) ABSTRACT

An edge memory array mat with access lines that are split in half, and a bank of sense amplifiers formed in a region that separates the access line segment halves extending perpendicular to the access line segments. The sense amplifiers of the bank of sense amplifiers are coupled to opposing ends of a first subset of the half access lines pairs. The edge memory array mat further includes digit line (DL) jumpers or another structure configured to connect a second subset of the half access line pairs across the region occupied by the bank of sense amplifiers to form combined or extended access lines that extend to a bank of sense amplifiers coupled between the edge memory array mat and an inner memory array mat.

21 Claims, 6 Drawing Sheets

EDGE MEMORY ARRAY MATS WITH SENSE AMPLIFIERS

BACKGROUND

Current implementations of dynamic random-access memory (DRAM) device arrays implement row segment sections where even and odd row segments of memory cells are interleaved. Sense amplifiers are connected to sequential row segments, and use one of the two row segments as reference when reading the other row segment. As a result, at the edges of an array, the row segments sections include border row segments. These border segments are interleaved with other row segment sections, but the other row segment sections are not connected to circuitry that allows them to be used for storing data. Therefore, in these border row segment sections, only half of the memory cells in the section are used to store data. Because only half of the memory cells are used, significant areas around the edge of an array are consumed by unused memory cells.

DETAILED DESCRIPTION

Figure 1:
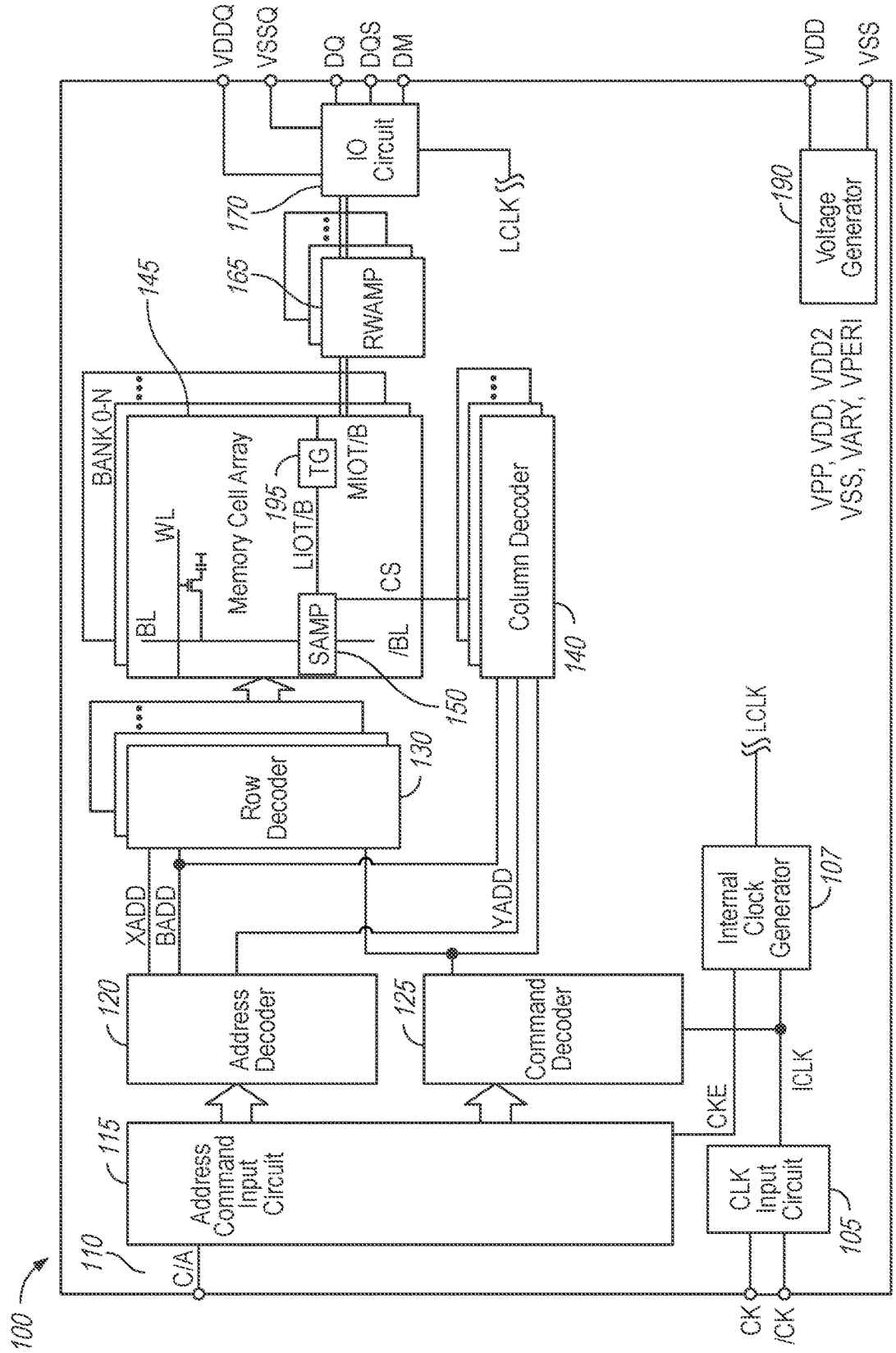
FIG. 1 illustrates a schematic block diagram of a semiconductor device in accordance with an embodiment of the present disclosure.

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

This disclosure describes memory array implementations where all memory cells of an edge memory array mat may be configured to be used to store and access data. An edge memory array mat may include digit lines (e.g., access lines, bitlines, data input/output (I/O) lines, etc.) that are split in half and a bank of sense amplifiers formed in a region that separates the digit line halves extending perpendicular to the digit lines. The sense amplifiers of the bank of sense amplifiers are coupled to opposing ends of a first subset of the half digit lines pairs (e.g., complementary digit lines formed from individual halves of the first subset of the half digit lines pairs). The edge memory array mat further includes digit line (DL) jumpers or another structure configured to connect a second subset of the half digit line pairs across the region occupied by the bank of sense amplifiers to form combined or extended digit lines that extend to a bank of sense amplifiers coupled between the edge memory array mat and an inner memory array mat (e.g., complementary digit lines formed from the combined or extended digit line and a digit line of the inner memory array mat).

During fabrication, digit lines may be formed in a memory array mat with an interleaved arrangement such that even digit lines are configured to couple to a first bank of sense amplifiers at a first end and odd digit lines are configured to couple to a second bank of sense amplifiers at a second end opposite the first end. To perform a sense operation, sense amplifiers are coupled to two complementary digit lines in such a way that the data state of a memory cell coupled to one of the two complementary digit lines causes the sense amplifier to drive one digit line to a first logical value and the other digit line to a second logical value opposite the first logical value. Thus, the first bank of sense amplifiers may be coupled to a respective second set of digit lines of a first adjacent memory array mat and second bank of sense amplifiers may be coupled to a respective second set of digit lines of a second adjacent memory array mat. For an edge memory array mat that forms an outer edge of a memory array, one set of interleaved digit lines may be coupled to a first bank of sense amplifiers formed near a first (inner) end between the edge memory array mat and an inner memory array mat. However, because a sense amplifier may be coupled between two complementary digit lines or loads to perform a sense operation, the second set of digit lines of the edge memory array mat may be unable to support a sense amplifier coupled to the second (outer) end near an edge of the memory array, as there is no set of complementary digit lines to support operation of the sense amplifier.

Thus, to avoid edge memory array mats having half of the digit lines (and corresponding memory cells) being unused, the digit lines of the edge memory array mat may be split (e.g., or divided) to form a space or region between the digit lines, and a bank of sense amplifiers may be formed in the edge memory array mat in the space or region where the digit lines are split. The sense amplifiers of the bank of amplifiers formed in the space between the digit lines of the edge memory array mat may be coupled to a first subset of the half digit line pairs of the edge array mat. Digit line (DL) jumpers or another structure may be formed to connect a second subset of the half digit line pairs across the region occupied by the bank of sense amplifiers formed in the edge memory array mat. The second subset of the half digit line pairs, when connected via the DL jumper or other structure, form combined or extended digit lines that are configured to couple to a bank of sense amplifiers formed between the edge memory array mat and an inner memory array mat. In some examples, the digit lines and the sense amplifiers may be formed, at least in part, using a first metal layer, and the DL jumpers may be formed across an area occupied by the bank sense amplifiers using a second metal layer. Splitting the digit lines and forming a set of sense amplifiers and a set of DL jumpers or other structures in an edge array mat may more efficiently use memory cells of the edge memory array mat by avoiding half of the digit lines (and corresponding memory cells) from being unused during operation of the memory. This allows for greater memory density as compared with implementations that include unused digit lines in edge memory array mats.

FIG. 1 illustrates a schematic block diagram of a semiconductor device 100 in accordance with an embodiment of the present disclosure. The semiconductor device 100 includes a memory die. The memory die may include a command/address input circuit 115, an address decoder 120, a command decoder 125, a clock input circuit 105, internal clock generator 107, row decoder 130, column decoder 140, a memory cell array 145, read/write amplifiers 165, an I/O circuit 170, and power circuit 190.

In some embodiments, the semiconductor device 100 may include, without limitation, a dynamic random-access memory (DRAM) device, such as double data rate (DDR) DDR4, DDR5, low power (LP) DDR, integrated into a single semiconductor chip, for example. The die may be mounted on an external substrate, for example, a memory module substrate, a mother board or the like. The semiconductor device 100 may further include a memory cell array 145. The memory cell array 145 includes a plurality of banks, each bank including a plurality of word lines WL, a plurality of bit lines BL (e.g., digit lines, access lines, data I/O lines, etc.), and a plurality of memory cells MC arranged at intersections of the plurality of word lines WL and the plurality of bit lines BL. The selection of the word line WL is performed by a row decoder 130 and the selection of the bit line BL (along with a column select signal CS) is performed by a column decoder 140. Sense amplifiers (SA) 150 are located near their corresponding bit lines BL and connected to at least one respective local I/O line based on the CS signal, which is in turn coupled to a respective one of at least two main I/O line pairs, via transfer gates (TG) 195, which function as switches.

In some embodiments, the memory cell array 145 may include memory array mats having respective digit lines and memory cells. The memory array mats may be separated by areas for control circuitry, including the sense amplifiers 150 connected to a respective subset (e.g., even or odd) bitlines of adjacent memory array mats to perform sense operations on corresponding memory cells. In some examples, a bank of sense amplifiers 150 positioned between two inner memory array mats or positioned between an inner memory array mat and an edge memory array mat (i.e., a memory array mat that includes one edge defining a portion of an outer border of the memory cell array 145) may each be coupled between a respective subset (e.g., even or odd) of complementary bitline pairs, and may be configured to perform a sense operation on a memory cell coupled to one bitline of a corresponding complementary bitline pair of the respective subset of bitline pairs.

In the edge memory array mat, bitline segments may be split (e.g., physically separated or divided), and a bank of sense amplifiers 150 may be formed in a region where the bitline segments are split. The bitline segments may be split in half (e.g., based on a number of rows of connected memory cells) coupled to each half of the bitline segment). Each sense amplifier of the bank of amplifiers 150 may be coupled to a first subset of the half bitline pairs of the edge array mat. Digit line (DL) jumpers or another structure may be formed to connect a second subset of the half bitline pairs across an area occupied by the bank of sense amplifiers 150 formed in the edge memory array mat to provide combined or extended bitlines. The combined or extended bitlines may be connected to the set of sense amplifiers 150 formed between the edge memory array mat and an inner memory array mat. Thus, by being coupled to the first subset of half bitline pairs, the set of sense amplifiers 150 formed in the edge memory array may be connected to a pair of complementary bitlines having a length that is half (e.g., based on a number of rows of connected memory cells) of a length of the combined or extended bitlines coupled to the sense amplifiers 150 positioned between two adjacent memory array mats.

In some examples, the bitlines and the sense amplifiers 150 may be formed, at least in part, using a first metal layer, and the DL jumpers may be formed across the set of sense amplifiers 150 using a second metal layer. In some examples, the bank of sense amplifiers 150 formed in the edge memory array mat may be schematically similar to the bank of sense amplifiers 150 formed between two adjacent memory array mats. In other examples, the bank of sense amplifiers 150 formed in the edge memory array mat may be schematically different than the bank of sense amplifiers 150 formed between two adjacent memory array mats. For example, the bank of sense amplifiers 150 formed in the edge memory array mat may include basic sense amplifier circuitry and the banks of sense amplifiers 150 formed between two adjacent memory array mats may include threshold voltage compensation circuitry in addition to the basic sense amplifier circuitry to accommodate sensing data on longer bitlines. By splitting the bitlines and forming a set of sense amplifiers 150 and a set of DL jumpers or other structures in an edge array mat may make more efficient use of the edge memory array mat and avoid half of the bitlines (and corresponding memory cells) from being unused during operation of the memory. This allows for greater memory density as compared with implementations that include unused bitlines in edge memory array mats.

The semiconductor device 100 may employ a plurality of external terminals that include address and command terminals coupled to command/address bus (C/A), clock terminals CK and/CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside via command/address bus 110. The address signal and the bank address signal supplied to the address terminals are transferred, via the command/address input circuit 115, to an address decoder 120. The address decoder 120 receives the address signal and decodes the address signal to provide decoded address signal ADD. The ADD signal includes a decoded row address signal and a decoded column address signal. The decoded row address signal is provided to the row decoder 130, and a decoded column address signal is provided to the column decoder 140. The address decoder 120 also receives the bank address signal and supplies the bank address signal to the row decoder 130, the column decoder 140.

The command/address terminals may further be supplied with a command signal from outside, such as, for example, a memory controller. The command signal may be provided, via the C/A bus, to the command decoder 125 via the command/address input circuit 115. The command decoder 125 decodes the command signal to generate various internal commands that include a row command signal ACT to select a word line and a column command signal Read/Write, such as a read command or a write command, to select a bit line, and a test mode signal.

Accordingly, when a read command is issued and a row address and a column address are timely supplied with the read command, read data is read from a memory cell in the memory cell array 145 designated by these row address and column address. The read data DQ is output to outside from the data terminals DQ (data), DQS (data strobe), and DM (data mask) via read/write amplifiers 165 and an input/output circuit 170. Similarly, when the write command is issued and a row address and a column address are timely supplied with this command, and then write data is supplied to the data terminals DQ, DQS, DM, the write data is received by data receivers in the input/output circuit 170, and supplied via the input/output circuit 170 and the read/write amplifiers 165 to the memory cell array 145 and written in the memory cell designated by the row address and the column address.

Turning to the explanation of the external terminals included in the semiconductor device 100, the clock terminals CK and /CK are supplied with an external clock signal and a complementary external clock signal, respectively. The external clock signals (including complementary external clock signal) may be supplied to a clock input circuit 105. The clock input circuit 105 may receive the external clock signals to generate an internal clock signal ICLK. The internal clock signal ICLK is supplied to an internal clock generator 107 and thus a phase controlled internal clock signal LCLK is generated based on the received internal clock signal ICLK. Although not limited thereto, a delay-locked loop (DLL) circuit, a duty cycle correction (DCC) circuit, or a combination thereof may be used as the internal clock generator 107. The phase controlled internal clock signal LCLK may be used as a timing signal for determining an output timing of read data.

The power supply terminals are supplied with power supply potentials VDD and VSS. These power supply potentials VDD2 and VSS are supplied to the power circuit 190. The power circuit 190 generates various internal potentials VKK, VARY, VPERI, and the like based on the power supply potentials VDD2 and VSS. The internal potential VKK is mainly used in the row decoder 130, the internal potential VARY are mainly used in the sense amplifiers included in the memory cell array 145, and the internal potential VPERI is used in many other circuit blocks.

The power supply terminals are also supplied with power supply potentials VDDQ and VSSQ. These power supply potentials VDDQ and VSSQ are supplied to the input/output circuit 170. The power supply potentials VDDQ and VSSQ are typically the same potentials as the power supply potentials VDD2 and VSS, respectively. However, the dedicated power supply potentials VDDQ and VSSQ are used for the input/output circuit 170 so that power supply noise generated by the input/output circuit 170 does not propagate to the other circuit blocks.

Figure 2:
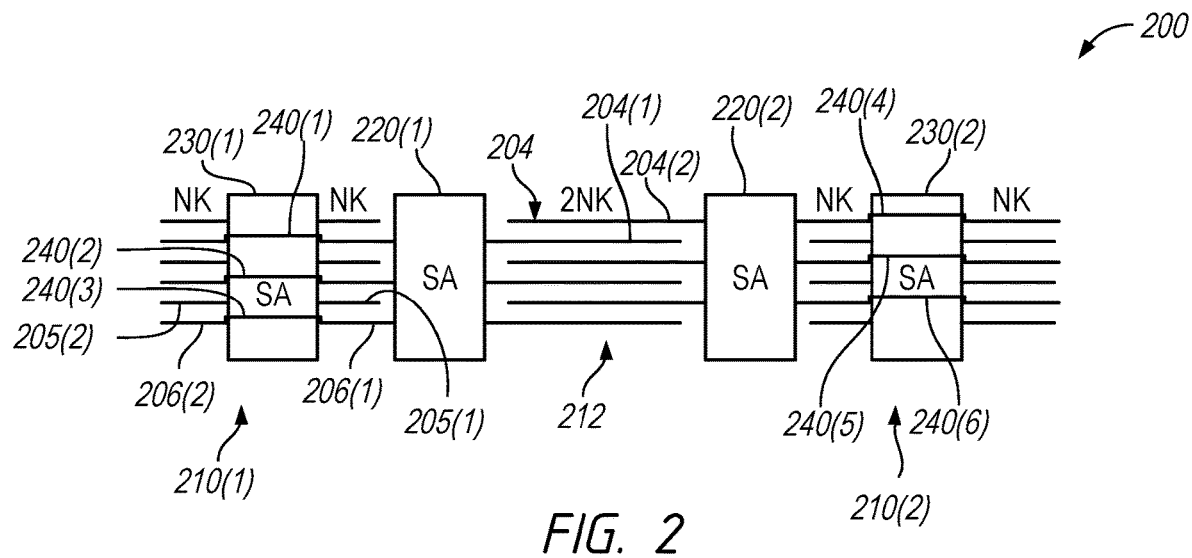
FIG. 2 illustrates a schematic block diagram of a portion of a memory array in accordance with an embodiment of the disclosure.

FIG. 2 illustrates a schematic block diagram of a portion of a memory array 200 in accordance with an embodiment of the disclosure. The memory array 200 includes a pair edge memory array mats 210(1)-(2) positioned on opposite sides of an inner memory array mat 212, sense amplifier bank 220(1) and sense amplifier bank 220(2) positioned between the inner memory array mat 212 and a respective one of the pair edge memory array mats 210(1)-(2), sense amplifier bank 230(1) positioned in the edge memory array mat 210(1) and sense amplifier bank 230(2) positioned in the edge memory array mat 210(2). The memory cell array 145 of FIG. 1 may implement the memory array 200 of FIG. 2.

The inner memory array mat 212 may include individual digit line (e.g., bitline, access line, or data I/O line) segments digit line segments 204, with a first set of the digit line segments 204 coupled to the sense amplifier bank 220(1) and a second set of the digit line segments 204 interleaved with the first set coupled to the sense amplifier bank 220(2).

The pair edge memory array mats 210(1)-(2) may each include pairs of digit line segments 205(1)-(2) arranged on either side of and coupled to the sense amplifier bank 230(1) or the sense amplifier bank 230(2), respectively. The pair edge memory array mats 210(1)-(2) may each further include pairs of digit line segments 206(1)-(2) arranged on either side of and coupled together via a respective one of the DL jumpers 240(1)-(6) to form combined or extended digit line segments. The pairs of digit line segments 205(1)-(2) may be interleaved with the pairs of digit line segments 206(1)-(2). Within the memory array mat 210(1), each pair of the pairs of digit line segments 205(1)-(2) may be coupled to a respective sense amplifier of the sense amplifier bank 230(1) and each of the extended or combined digit line segments (e.g., pair of the pairs of digit line segments 206(1)-(2) coupled together via respective ones of the DL jumpers 240(1)-(3)) may be coupled to a respective sense amplifier of the sense amplifier bank 220(1). Within the memory array mat 210(2), each pair of the pairs of digit line segments 205(1)-(2) may be coupled to a respective sense amplifier of the sense amplifier bank 230(2) and each of the extended or combined digit line segments (e.g., a pair of the pairs of digit line segments 206(1)-(2) (coupled together via respective ones of the DL jumpers 240(4)-(6)) may be coupled to a respective sense amplifier of the sense amplifier bank 220(1).

The DL jumpers 240(1)-(6) may be formed to cross an area or region occupied by the sense amplifier bank 230(1) or the sense amplifier bank 230(2) to connect one digit line segment 206(1) to a corresponding digit line segment 206(2). The DL jumpers 240(1)-(6) may be structurally formed using a different layer than the pairs of digit line segments 205(1)-(2), the pairs of digit line segments 206(1)-(2), and the sense amplifier bank 230(1) or sense amplifier bank 230(2). Each of the DL jumpers 240(1)-(6) may be constructed from a conductive material. For example, the digit line segment 205(1), the digit line segment 205(2), the digit line segment 206(1), the digit line segment 206(2), the sense amplifier bank 230(1), and sense amplifier bank 230(2) may be formed, at least in part, using a first metal layer, and the DL jumpers 240(1)-(6) may include a second metal layer portion that extends across an area that includes the respective sense amplifier bank 230(1) or the sense amplifier bank 230(2). The second metal layer may be above or below the first metal layer, in some examples.

Each individual digit line segment of the pairs of digit line segments 205(1)-(2) and the pairs of digit line segments 206(1)-(2) may have a length (e.g., based on a number of coupled rows of memory cells (not shown)) that is half of a length of the digit line segments 204 of the inner memory array mat 212. For example, each of the digit line segment 205(1), the digit line segment 205(2), the digit line segment 206(1), and the digit line segment 206(2) may have a length of N thousand (NK) rows, and each of the digit line segments 204 may have a length of 2NK rows. In some examples, N may be equal to any integer, such as 1, 2, 4, 8, etc.

A NK plus NK or 2NK length of the combined or extended digit line segments (e.g., the pairs of digit line segments 206(1)-(2) connected together by one of the DL jumpers 240(1)-(6)) may match the 2NK length of each of the digit line segments 204. For example, the combined or extended digit line segment that includes the DL jumper 240(1) and the digit line 204(1) may form complementary 2NK length digit lines that are coupled to a particular sense amplifier of the sense amplifier bank 220(1). Similarly, the combined or extended digit line segment that includes the DL jumper 240(4) and the digit line 204(2) may form complementary 2NK length digit lines that are coupled to a particular sense amplifier of the sense amplifier bank 220(2). Differences in relative lengths of a pair of digit line coupled to any sense amplifier of any of the sense amplifier bank 220(1), sense amplifier bank 220(2), sense amplifier bank 230(1), or sense amplifier bank 230(2) may negatively affect operation of the sense amplifier due to capacitive and impedance differences. Thus, because the digit line segment 205(1) and the digit line segment 205(2) have a common NK length, the sense amplifiers of the sense amplifier bank 230(1) and the sense amplifier bank 230(2) being coupled to individual pairs of the pairs of digit line segments 205(1)-(2) may experience similar capacitive and impedance loads on coupled digit line segments 205(1) and 205(2). Similarly, because each of the digit line segments 204 and the combined or extended digit line segments (e.g., a pair of the digit line segments 206(1)-(2) coupled together via the DL jumpers 240(1)-(6)) have a common 2NK length, the sense amplifiers of the sense amplifier bank 220(1) and the sense amplifier bank 220(2) may experience similar capacitive and impedance loads.

In some examples, sense amplifier of the sense amplifier bank 230(1) and the sense amplifier bank 230(2) may be schematically similar to sense amplifiers of the sense amplifier bank 220(1) and the sense amplifier bank 220(2). In some examples, components of the sense amplifiers of the sense amplifier bank 230(1) and the sense amplifier bank 230(2) may have a different (e.g., smaller) size than schematically common components of the sense amplifier bank 230(1) and the sense amplifier bank 230(2) to accommodate the differences in digit line segment lengths (e.g., NK vs. 2NK). The sense amplifiers of the sense amplifier bank 230(1) and the sense amplifier bank 230(2) having smaller components than the sense amplifiers of the sense amplifier bank 220(1) and the sense amplifier bank 220(2) may result in a smaller layout area for the sense amplifiers of the sense amplifier bank 230(1) and the sense amplifier bank 230(2) as compared with the sense amplifiers of the sense amplifier bank 220(1) and the sense amplifier bank 220(2). In other examples, the sense amplifier bank 230(1) and the sense amplifier bank 230(2) may be schematically different than the sense amplifier bank 220(1) and the sense amplifier bank 220(2). For example, the sense amplifier bank 230(1) and the sense amplifier bank 230(2) may include basic sense amplifier circuitry and the sense amplifier bank 220(1) and the sense amplifier bank 220(2) may include threshold voltage compensation circuitry in addition to the basic sense amplifier circuitry to accommodate sensing data on longer digit line segments digit line segments 204 and the respective combinations of the digit line segment 206(1), one of the DL jumpers 240(1)-(6), and the digit line segment 206(2).

While FIG. 2 depicts the inner memory array mat 212 with 6 of the digit line segments digit line segments 204 and depicts each of the pair edge memory array mats 210(1)-(2) with 6 pairs of digit line segments (e.g., 3 of the pairs of digit line segments 205(1)-(2) and 3 of the pairs of digit line segments 206(1)-(2)), it is appreciated that the inner memory array mat 212 and each of the pair edge memory array mats 210(1)-(2) may include more than 6 digit line segments.

Figure 3:
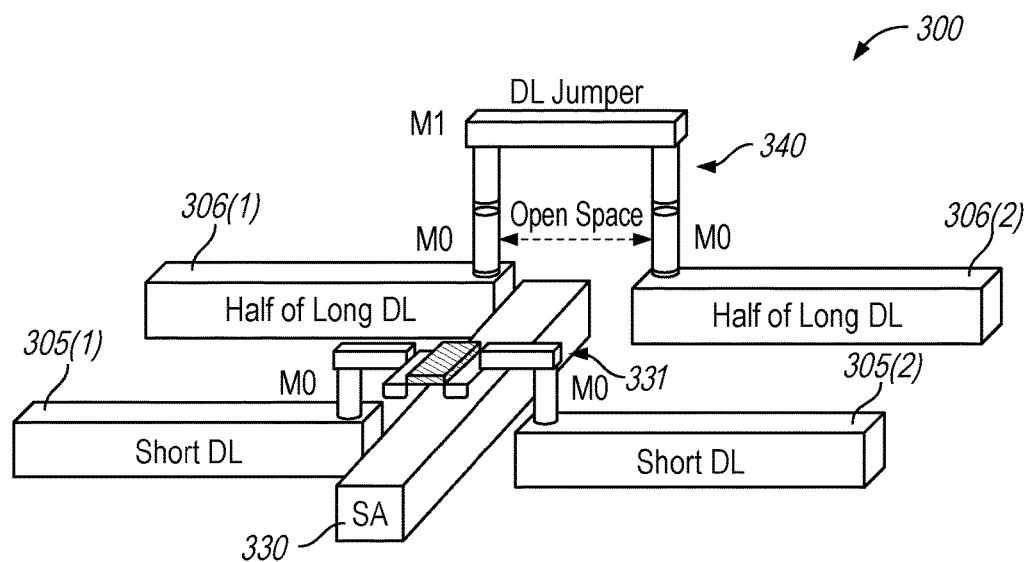
FIG. 3 illustrates a perspective view of a schematic diagram of a portion of an edge memory array mat in accordance with an embodiment of the disclosure.

FIG. 3 illustrates a perspective view of a schematic diagram of a portion of an edge memory array mat 300 in accordance with an embodiment of the disclosure. Any of the memory cell array 145 of FIG. 1 and/or any either or both of the pair edge memory array mats 210(1)-(2) of FIG. 2 may implement one or more of the portion of the edge memory array mat 300, in some examples.

The edge memory array mat 300 may include a pair of digit line segments 305(1)-(2) arranged on either side of and coupled to a sense amplifier 331 of a sense amplifier bank 330. The edge memory array mat 300 may further include a pair of digit line segments 306(1)-(2) arranged on either side of and coupled together via a DL jumper 340 to form a combined or extended digit line segment.

The DL jumper 340 may be formed to cross an area or region occupied by the sense amplifier bank 330 to connect the digit line segment 306(1) to the digit line segment 306(2). The DL jumper 340 may be structurally formed using a different layer than the pair of digit line segments 305(1)-(2), the pair of digit line segments 306(1)-(2), and the sense amplifier bank 330. The DL jumper 340 may be constructed from a conductive material. For example, the digit line segment 305(1), the digit line segment 305(2), the digit line segment 306(1), the digit line segment 306(2), and the sense amplifier bank 330 may be formed, at least in part, using a first metal layer M0, and the DL jumper 340 may include a second metal layer portion M1 that extends across an area that includes the sense amplifier bank 330. The DL jumper 340 may include vias or some other structure to electrically connect respective ends of the pair of digit line segments 306(1)-(2) adjacent the sense amplifier bank 330 at the first metal layer M0 to the second layer portion M1 of the DL jumper 340.

Each individual digit line segment of the pair of digit line segments 305(1)-(2) and the pair of digit line segments 306(1)-(2) may have a common length (e.g., based on a number of coupled rows of memory cells (not shown)). For example, each of the digit line segment 305(1), the digit line segment 305(2), the digit line segment 306(1), and the digit line segment 306(2) may have a length of N thousand (NK) rows. By coupling the pair of digit line segments 306(1)-(2) together via the DL jumper 340, the formed combined or extended digit line segment may have a 2NK length, which may be coupled to a bank of sense amplifiers coupled to an inner array mat having 2NK digit line segments (not shown).

Figure 4:
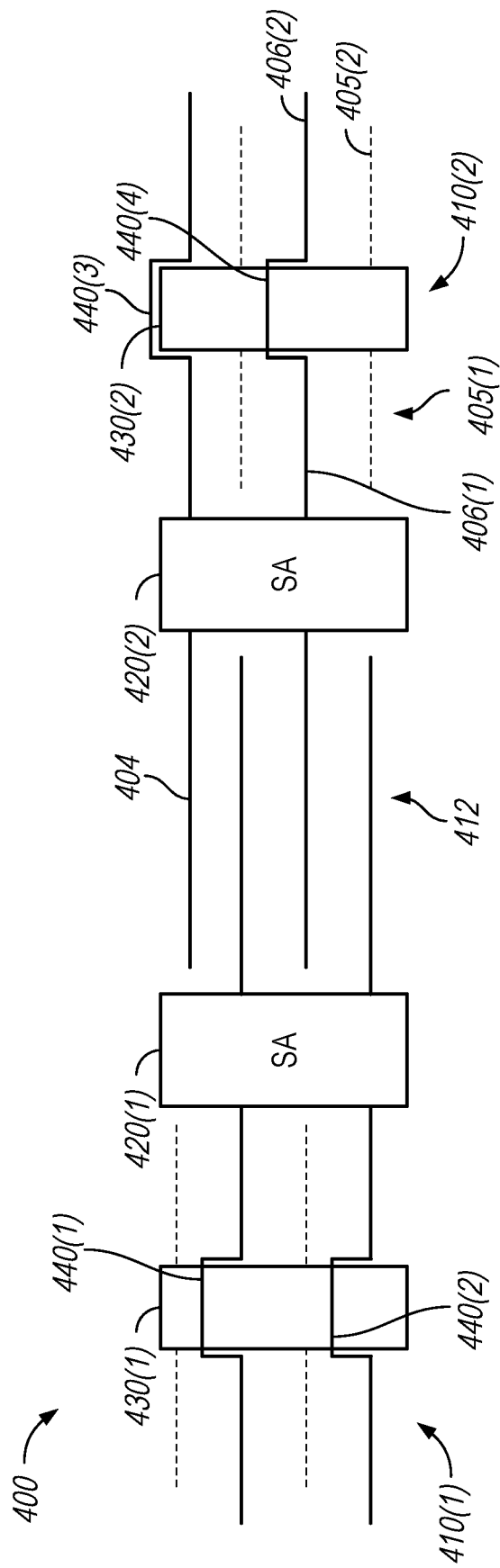
FIG. 4 illustrates a simplified schematic block diagram of a portion of a memory array in accordance with an embodiment of the disclosure.

FIG. 4 illustrates a simplified schematic block diagram of a portion of a memory array 400 in accordance with an embodiment of the disclosure. The memory array 400 includes a pair edge memory array mats 410(1)-(2) positioned on opposite sides of an inner memory array mat 412, sense amplifier bank 420(1) and sense amplifier bank 420(2) positioned between the inner memory array mat 412 and a respective one of the pair edge memory array mats 410(1)-(2), sense amplifier bank 430(1) positioned in the edge memory array mat 410(1) and sense amplifier bank 430(2) positioned in the edge memory array mat 410(2). The memory cell array 145 of FIG. 1 and/or the memory array 200 of FIG. 2 may implement the memory array 400 of FIG. 4. The 400 may implement at least one of the portion of the edge memory array mat 300 of FIG. 3, in some examples.

The inner memory array mat 412 may include individual digit line (e.g., bitline, digit line, or digit line) segments digit line segments 404, with a first set of digit line segments digit line segments 404 coupled to the sense amplifier bank 420(1) and a second set interleaved with the first set coupled to the sense amplifier bank 420(2).

The pair edge memory array mats 410(1)-(2) may each include pairs of digit line segments 405(1)-(2) arranged on either side of and coupled to the sense amplifier bank 430(1) or the sense amplifier bank 430(2), respectively. The pair edge memory array mats 410(1)-(2) may each further include pairs of digit line segments 406(1)-(2) arranged on either side of and coupled together via a respective one of the DL jumpers 440(1)-(4) to form combined or extended digit line segments. The pairs of digit line segments 405(1)-(2) may be interleaved with the pairs of digit line segments 406(1)-(2). Within the memory array mat 410(1), each pair of the pairs of digit line segments 405(1)-(2) may be coupled to a respective sense amplifier of the sense amplifier bank 430(1) and the combined or extended digit line segments (e.g., the pairs of digit line segments 406(1)-(2) coupled together via respective ones of the DL jumpers 440(1)-(2)) may be coupled to a respective sense amplifier of the sense amplifier bank 420(1). Within the memory array mat 410(2), each pair of the pairs of digit line segments 405(1)-(2) may be coupled to a respective sense amplifier of the sense amplifier bank 430(2) and the formed combined or extended digit line segments (e.g., the pairs of digit line segments 406(1)-(2) coupled together via respective ones of the DL jumpers 440(3)-(4)) may be coupled to a respective sense amplifier of the sense amplifier bank 420(1).

The DL jumpers 440(1)-(4) may be formed to cross an area occupied by the sense amplifier bank 430(1) or the sense amplifier bank 430(2) to connect one digit line segment 406(1) to a corresponding digit line segment 406(2). The DL jumpers 440(1)-(6) may be structurally formed using a different layer than the pairs of digit line segments 405(1)-(2), the pairs of digit line segments 406(1)-(2), and the sense amplifier bank 430(1) or sense amplifier bank 430(2). Each of the DL jumpers 440(1)-(4) may be constructed from a conductive material. For example, the digit line segment 405(1), the digit line segment 405(2), the digit line segment 406(1), the digit line segment 406(2), the sense amplifier bank 430(1), and sense amplifier bank 430(2) may be formed, at least in part, using a first metal layer, and the DL jumpers 440(1)-(4) may include a second metal layer portion that extends across an area that includes the respective sense amplifier bank 430(1) or the sense amplifier bank 430(2). The second metal layer may be above or below the first metal layer, in some examples.

Each individual digit line segment of the pairs of digit line segments 405(1)-(2) and the pairs of digit line segments 406(1)-(2) may have a length (e.g., based on a number of coupled rows of memory cells (not shown)) that is half of a length of the digit line segments 404 of the inner memory array mat 412. For example, each of the digit line segment 405(1), the digit line segment 405(2), the digit line segment 406(1), and the digit line segment 406(2) may have a length of N thousand (NK) rows, and each of the digit line segments 404 may have a length of 2NK rows. In some examples, N may be equal to any integer, such as 1, 2, 4, 8, etc.

A NK plus NK or 2NK length of the combined or extended digit line segment (e.g., the pairs of digit line segments 406(1)-(2) connected together by the DL jumpers 440(1)-(4)) may match the 2NK length of each of the digit line segments 404. Differences in relative lengths of a pair of digit line coupled to any sense amplifier of any of the sense amplifier bank 420(1), sense amplifier bank 420(2), sense amplifier bank 430(1), or sense amplifier bank 430(2) may negatively affect operation of the sense amplifier due to capacitive and impedance differences. Thus, because the digit line segment 405(1) and the digit line segment 405(2) have a common NK length, the sense amplifiers of the sense amplifier bank 430(1) and the sense amplifier bank 430(2) being coupled to individual pairs of the pairs of digit line segments 405(1)-(2) may experience similar capacitive and impedance loads on coupled digit line segments 405(1) and 405(2). Similarly, because each of the digit line segments 404 and the extended or combined digit line segments (e.g., the pair of digit line segments 406(1)-(2) coupled together via the DL jumpers 440(1)-(4)) have a common 2NK length, the sense amplifiers of the sense amplifier bank 420(1) and the sense amplifier bank 420(2) may experience similar capacitive and impedance loads.

In some examples, the sense amplifier bank 430(1) and the sense amplifier bank 430(2) may be schematically similar to the sense amplifier bank 420(1) and the sense amplifier bank 420(2). In some examples, components of the sense amplifiers of the sense amplifier bank 430(1) and the sense amplifier bank 430(2) may have a different (e.g., smaller) size than schematically common components of the sense amplifier bank 430(1) and the sense amplifier bank 430(2) to accommodate the differences in digit line segment lengths (e.g., NK vs. 2NK). The sense amplifiers of the sense amplifier bank 430(1) and the sense amplifier bank 430(2) having smaller components than the sense amplifiers of the sense amplifier bank 420(1) and the sense amplifier bank 420(2) may result in a smaller layout area for the sense amplifiers of the sense amplifier bank 430(1) and the sense amplifier bank 430(2) as compared with the sense amplifiers of the sense amplifier bank 420(1) and the sense amplifier bank 420(2). In other examples, the sense amplifier bank 430(1) and the sense amplifier bank 430(2) may be schematically different than the sense amplifier bank 420(1) and the sense amplifier bank 420(2). For example, the sense amplifier bank 430(1) and the sense amplifier bank 430(2) may include basic sense amplifier circuitry and the sense amplifier bank 420(1) and the sense amplifier bank 420(2) may include threshold voltage compensation circuitry in addition to the basic sense amplifier circuitry to accommodate sensing data on longer digit line segments digit line segments 404 and the respective combinations of the digit line segment 406(1), one of the DL jumpers 440(1)-(6), and the digit line segment 406(2).

While FIG. 4 depicts the inner memory array mat 412 with 4 of the digit line segments digit line segments 404 and depicts each of the pair edge memory array mats 410(1)-(2) with 6 pairs of digit line segments (e.g., 2 of the pairs of digit line segments 405(1)-(2) and 2 of the pairs of digit line segments 406(1)-(2)), it is appreciated that the inner memory array mat 412 and each of the pair edge memory array mats 410(1)-(2) may include more than 4 digit line segments.

Figure 5:
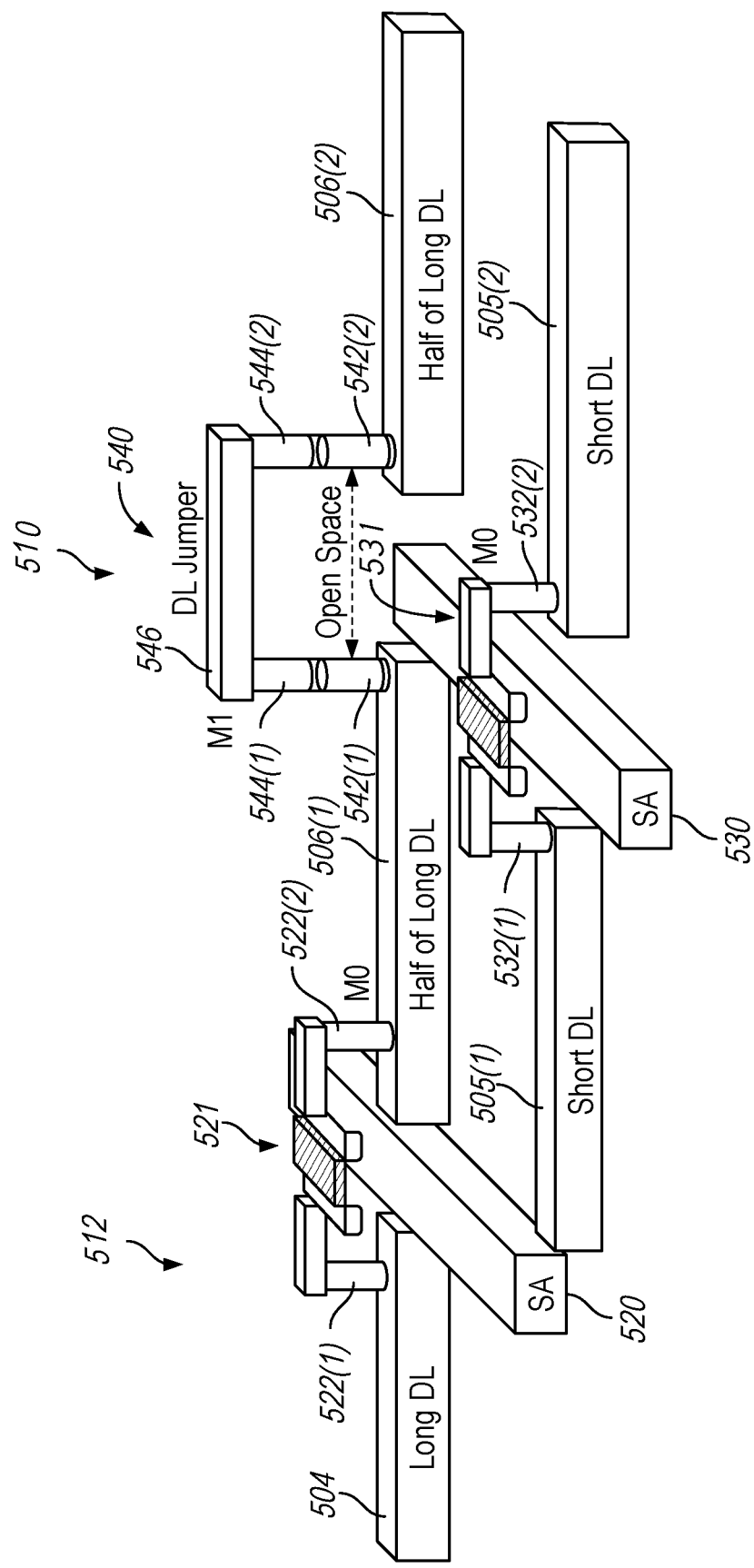
FIG. 5 illustrates a perspective view of a schematic diagram of a portion of a memory array in accordance with an embodiment of the disclosure.

FIG. 5 illustrates a perspective view of a schematic diagram of a portion of a memory array 500 in accordance with an embodiment of the disclosure. The memory array 500 includes an edge memory array mat edge memory array bank 510 adjacent to an inner memory array mat 512, a sense amplifier bank sense amplifier bank 520 positioned between the inner memory array mat 512 and the edge memory array mat edge memory array bank 510, and a sense amplifier bank sense amplifier bank 530 positioned in the edge memory array mat edge memory array bank 510. Any of the memory cell array 145 of FIG. 1 and/or any either or both of the pair edge memory array mats 210(1)-(2) of FIG. 2 may implement one or more of the portion of the memory array 500, in some examples.

The inner memory array mat 512 may include a digit line (e.g., bitline, access line, or data I/O line) segment digit line segment 504 coupled to a sense amplifier 521 of the sense amplifier bank 520 via 522(1).

The edge memory array bank 510 may include a pair of digit line segments 505(1)-(2) arranged on either side of and coupled to a sense amplifier 531 of a sense amplifier bank 530 via vias 532(1)-(2), respectively. The edge memory array bank 510 may further include a pair of digit line segments 506(1)-(2) arranged on either side of and coupled together via a DL jumper 540 to form an combined or extended digit line segment, with the 506(1) coupled to the sense amplifier 521 of the sense amplifier bank 520 via a via 522(2). The pair of digit line segments 505(1)-(2) may be interleaved with the pair of digit line segments 506(1)-(2).

The DL jumper 540 may be formed to cross an area occupied by the sense amplifier bank 530 to connect the digit line segment 506(1) to the digit line segment 506(2). The DL jumper 540 may be structurally formed using a different layer than the pair of digit line segments 505(1)-(2), the pair of digit line segments 506(1)-(2), the sense amplifier bank 530, and the sense amplifier bank 520. The DL jumper 540 may be constructed from a conductive material. For example, the digit line segment 505(1), the digit line segment 505(2), the digit line segment 506(1), the digit line segment 506(2), and the sense amplifier bank 530 may be formed, at least in part, using a first metal layer M0, and the DL jumper 540 may include a second metal layer portion M1 546 that extends across an area that includes the sense amplifier bank 530. The DL jumper 540 may include vias 542(1)-(2) stacked on vias 544(1)-(2), respectively, or some other structure, to electrically connect respective ends of the pair of digit line segments 506(1)-(2) adjacent the sense amplifier bank 530 at the first metal layer M0 to the second layer portion M1 546 of the DL jumper 540.

Each individual digit line segment of the pair of digit line segments 505(1)-(2) and the pair of digit line segments 506(1)-(2) may have a common length (e.g., based on a number of coupled rows of memory cells (not shown)), and the digit line segment 504 may have a length twice the length of each of the individual digit line segments of the pair of digit line segments 505(1)-(2) and the pair of digit line segments 506(1)-(2). For example, each of the digit line segment 505(1), the digit line segment 505(2), the digit line segment 506(1), and the digit line segment 506(2) may have a length of N thousand (NK) rows of memory cells, and the digit line segment 504 may have a length of 2NK rows of memory cells. Coupling the pair of digit line segments 506(1)-(2) together via the DL jumper 540 may provide a digit line segment having a length of 2NK rows to match the length of the digit line segment 504. In some examples, N may be equal to any integer, such as 1, 2, 4, 8, etc.

In some examples, the sense amplifier 531 may be schematically similar to the sense amplifier 521. In some examples, components of the sense amplifier 531 may have a different (e.g., smaller) size than schematically common components of the sense amplifier 521 to accommodate the differences in digit line segment lengths (e.g., NK vs. 2NK). The sense amplifier 531 having smaller components than the sense amplifier 521 may result in a smaller layout area for the sense amplifier 531 as compared with the sense amplifier 521. In other examples, the sense amplifier 531 may be schematically different than the sense amplifier 521. For example, the sense amplifier 531 may include basic sense amplifier circuitry and the sense amplifier 521 may include threshold voltage compensation circuitry in addition to the basic sense amplifier circuitry to accommodate sensing data on longer digit line segments digit line segments 404 and the respective combination of the digit line segment 506(1), the DL jumper 540, and the access line segment 506(2).

Figure 6:
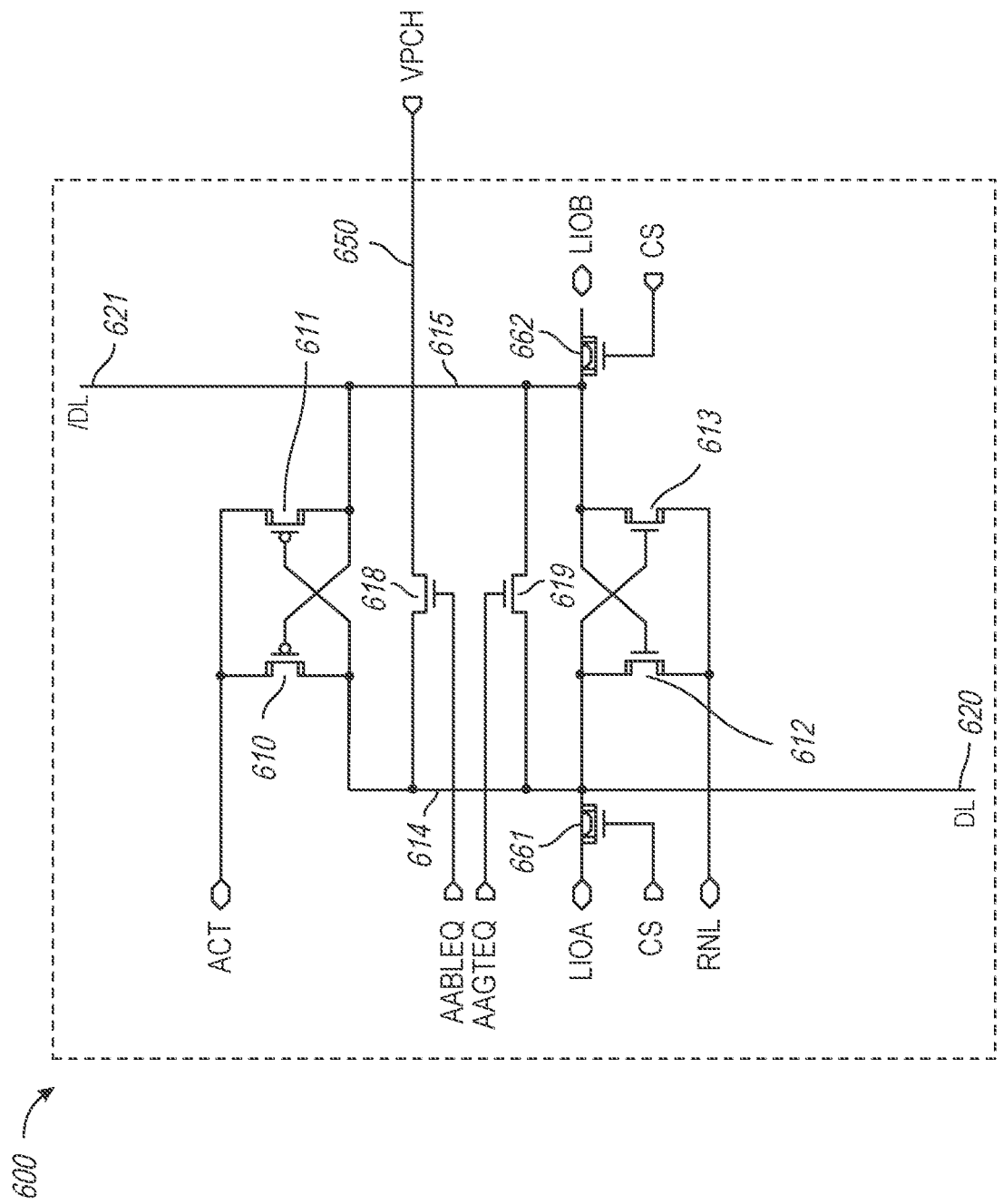
FIG. 6 is a circuit diagram of a sense amplifier in accordance with an embodiment of the disclosure.

FIG. 6 is a circuit diagram of a (e.g., basic or traditional) sense amplifier 600 in accordance with an embodiment of the disclosure. The sense amplifier 600 may be included in one or more of the sense amplifiers 150 of FIG. 1. Any of the sense amplifier banks 220(1), 220(2), 230(1), or 230(2) of FIG. 2, the sense amplifier bank 330 of FIG. 3, any of the sense amplifier banks 420(1), 420(2), 430(1), or 430(2) of FIG. 4, or any of the sense amplifier banks 520 or 530 of FIG. 5 may implement one or more of the sense amplifiers 600 in some examples. The sense amplifier 600 may include first type of transistors (e.g. p-type field effect transistors (PFET)) 610, 611 having drains coupled to drains of second type of transistors (e.g., n-type field effect transistors (NFET) 612, 613, respectively. The first type of transistors 610, 611 and the second type of transistors 612, 613 form complementary transistor inverters including a first inverter including the transistors 610 and 612 and a second inverter including the transistors 611 and 613. The first type of transistors 610, 611 may be coupled to a Psense amplifier control line (e.g., an activation signal ACT), which may provide a supply voltage (e.g., an array voltage VARY) at an active "high" level. The second type of transistors 612, 613 may be coupled to an Nsense amplifier control line (e.g., a Row Nsense Latch signal RNL) that may provide a reference voltage (e.g., a ground (GND) voltage) at an active "low" level. The sense amplifier 600 may sense and amplify the data state applied to sense nodes 614, 615 through the digit (or bit) lines DL 620 and/DL 621, respectively. The digit lines DL 620 and/DL 621 (sense nodes 614 and 615) may be coupled to local input/output nodes A and B (LIOA/B) through the second type of transistors 661 and 662, respectively, which may be rendered conductive when a column select signal CS is active. LIOT and LIOB may correspond to the LIOT/B lines of FIG. 1, respectively.

The sense amplifier 600 may further include transistors 618, 619, where the transistor 618 may couple the sense node 614 to a global power bus 650 and the transistor 619 may couple the sense node 614 to the sense node 615. The global power bus 650 may be coupled to a node that is configured to provide a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 618 and 619 may couple the global power bus 650 to the sense nodes 614 and 615 responsive to equilibrating signals AAGTEQ and AABLEQ provided on gates of the transistors 618 and 619.

In operation, the sense amplifier 600 may be configured to sense a data state of a coupled memory cell on the digit lines DL 620 and/DL 621 in response to received control signals (e.g., the ACT and RNL signals, the AABLEQ and AAGTEQ equalization signals, and the CS signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof. A sense operation may include an initial precharge/equalize phase and a sense phase.

During the initial precharge/equalize phase of a sense operation, the sense nodes 614 and 615 may be precharged at the VPCH voltage. For example, the global power bus 650 may be supplied with the VPCH voltage, and the AAGTEQ and AABLEQ signals may be in their active states, respectively. Accordingly, while in the initial precharge or standby phase, each of the digit lines DL 620 and/DL 621 and the sense nodes 614 and 615 may be precharged to the precharge voltage VPCH. In some examples, the VPCH voltage may be approximately half of the array voltage.

At the end of the initial precharge/equalize phase or the start of the sense phase, a wordline WL associated with the sense operation may be set to an active state. In some other examples, the wordline WL may be activated during the threshold voltage compensation phase.

During the sense phase, the sense amplifier 600 may sense a data state of memory cell coupled to the digit line DL 620 or/DL 621. After activation of the wordline WL, the ACT signal and the RNL signal being activated and set to the logic high level (e.g., the VARY voltage) and the logic low level (e.g., the GND voltage), respectively. During the sense phase, sense and amplify operations are then performed with the threshold voltage compensation voltage to balance the responses of the second type of transistors 612 and 613. For example, in response to a memory cell being coupled to a digit line DL 620 or/DL 621 through its respective access device, a voltage difference is created between the digit lines DL 620 and/DL 621. The voltage difference is sensed by the second type of transistors 612, 613 as the sources of the second type of transistors 612, 613 begin to be pulled to ground through fully activated RNL signal, and one of the second type of transistors 612, 613 with a gate coupled to the digit line DL 620 or/DL 621 with the slightly higher voltage begins conducting. When a memory cell coupled to sense node 614 via the digit line DL 620 stores a high data state, for example, the transistor 613 may begin conducting. Additionally, the other transistor 612 may become less conductive as the voltage of the sense node 615 with the slightly lower voltage decreases through the conducting transistor 613. Thus, the slightly higher and lower voltages are amplified to logic high and logic low voltages.

After the data state of the memory cell is sensed, and the sense nodes 614, 615 are each pulled to a respective one of the ACT signal and RNL signal voltages, a read may be performed in response to a READ command. For example, the CS signal may be activated (e.g., in response to the READ command), the digit lines DL 620 and/DL 621 (e.g., at sense nodes 614 and 615) may be coupled to the LIO nodes (LIOT and LIOB) and the data output may be provided to the LIO nodes. Thus, the data may be read out from the LIO nodes. After a read operation is completed, the CS signal may be set to an inactive state. The process may start over for a subsequent sensing operation.

Figure 7:
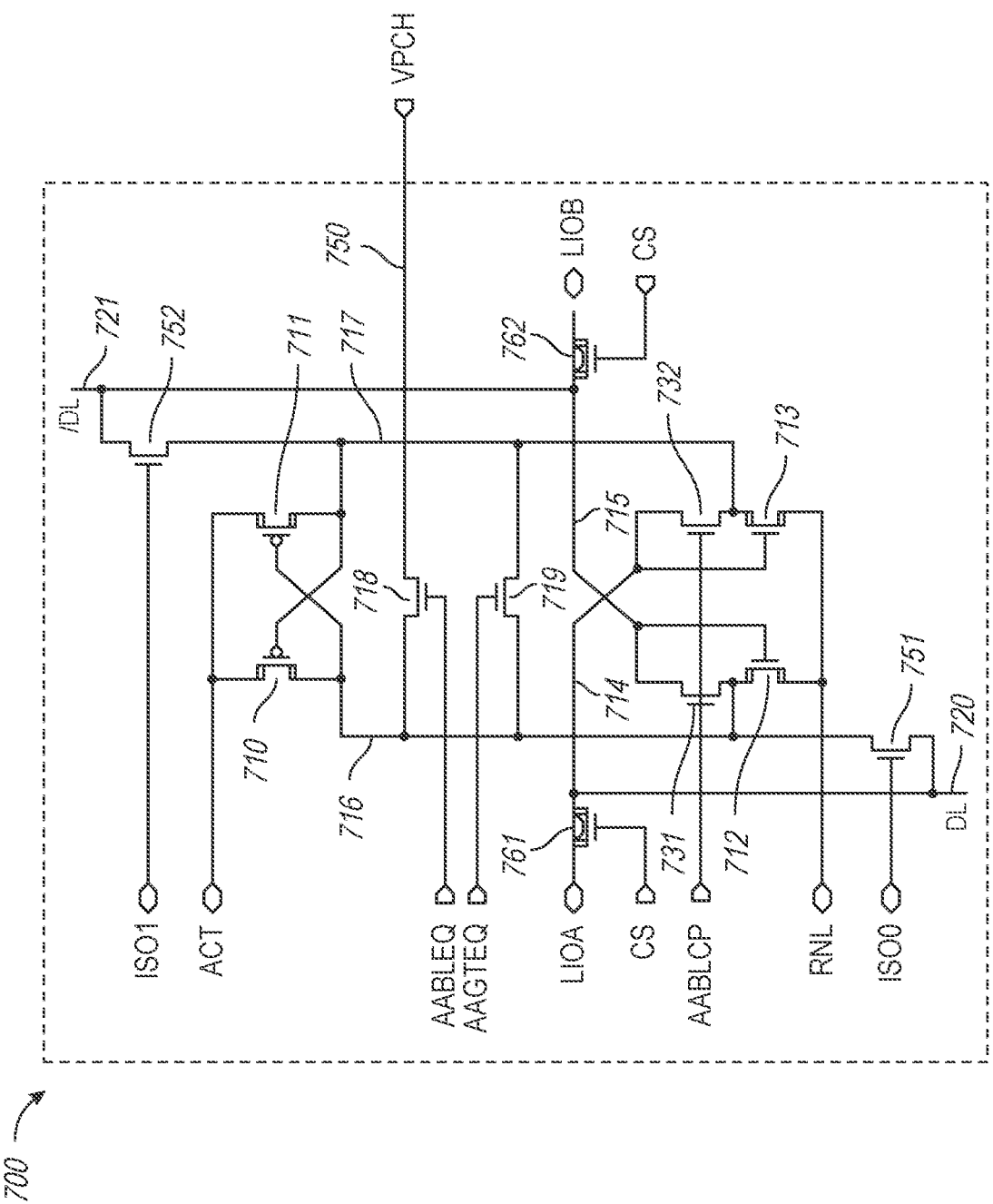
FIG. 7 is a circuit diagram of a threshold voltage compensation (VtC) sense amplifier in accordance with an embodiment of the disclosure.

FIG. 7 is a circuit diagram of a threshold voltage compensation (VtC) sense amplifier 700 in accordance with an embodiment of the disclosure. The VtC sense amplifier 700 may be included in one or more of the sense amplifiers 150 of FIG. 1. Any of the sense amplifier banks 220(1), 220(2), 230(1), or 230(2) of FIG. 2, the sense amplifier bank 330 of FIG. 3, any of the sense amplifier banks 420(1), 420(2), 430(1), or 430(2) of FIG. 4, or any of the sense amplifier banks 520 or 530 of FIG. 5 may implement one or more of the VtC sense amplifiers 700 in some examples. The VtC sense amplifier 700 may include first type of transistors (e.g. p-type field effect transistors (PFET)) 710, 711 having drains coupled to drains of second type of transistors (e.g., n-type field effect transistors (NFET) 712, 713, respectively. The first type of transistors 710, 711 and the second type of transistors 712, 713 form complementary transistor inverters including a first inverter including the transistors 710 and 712 and a second inverter including the transistors 711 and 713. The first type of transistors 710, 711 may be coupled to a Psense amplifier control line (e.g., an activation signal ACT), which may provide a supply voltage (e.g., an array voltage VARY) at an active "high" level. The second type of transistors 712, 713 may be coupled to an Nsense amplifier control line (e.g., a Row Nsense Latch signal RNL) that may provide a reference voltage (e.g., a ground (GND) voltage) at an active "low" level. The VtC sense amplifier 700 may sense and amplify the data state applied to sense nodes 714, 715 through the digit (or bit) lines DL 720 and/DL 721, respectively. Nodes 716 and 717 that may be gut nodes coupled to drains of the second type of transistors 712, 713 may be coupled to the digit lines DL 720 and/DL 721 via isolation transistors 751 and 752. The isolation transistors 751 and 752 may be controlled by isolation signals ISO0 and ISO1. The digit lines DL 720 and/DL 721 (sense nodes 714 and 715) may be coupled to local input/output nodes A and B (LIOA/B) through the second type of transistors 761 and 762, respectively, which may be rendered conductive when a column select signal CS is active. LIOT and LIOB may correspond to the LIOT/B lines of FIG. 1, respectively.

The VtC sense amplifier 700 may further include additional second type of transistors 731, 732 that have drains coupled to the sense nodes 715 and 714 and sources coupled to both the gut nodes 716 and 717 and the drains of the second type of transistors 712 and 713. Gates of the second types of transistors 731, 732 may receive a bit line compensation signal AABLCP and may provide voltage compensation for threshold voltage imbalance between the second type of transistors 712 and 713. The VtC sense amplifier 700 may further include transistors 718, 719, where the transistor 718 may couple the gut node 716 to a global power bus 750 and the transistor 719 may couple the gut node 716 to the gut node 717. The global power bus 750 may be coupled to a node that is configured to provide a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 718 and 719 may couple the global power bus 750 to the gut nodes 716 and 717 responsive to equilibrating signals AAGTEQ and AABLEQ provided on gates of the transistors 718 and 719.

In operation, the VtC sense amplifier 700 may be configured to sense a data state of a coupled memory cell on the digit lines DL 720 and/DL 721 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof. A sense operation may include several phases, such as an initial precharge or standby phase, a compensation phase, a gut equalize phase, and a sense phase.

During the initial precharge or standby phase of a sense operation, the gut nodes 716 and 717 may be precharged at the VPCH voltage. For example, the global power bus 750 may be supplied with the VPCH voltage and the AABLCP signal, the ISO0/ISO1 signals, and the AAGTEQ and AABLEQ signals may be in their active states, respectively. Accordingly, while in the initial precharge or standby phase, each of the digit lines DL 720 and/DL 721, the sense nodes 714 and 715 and the gut nodes 716 and 717 may be precharged to the precharge voltage VPCH. In some examples, the VPCH voltage may be approximately half of the array voltage.

After the initial precharge or standby phase, the VtC sense amplifier 700 may enter the threshold voltage compensation phase, where voltages on the digit lines DL 720 and/DL 721 are biased from the VPCH voltage (e.g., VBLP voltage) to compensate (e.g., provide threshold voltage compensation) for threshold voltage differences between the transistors 712, 713. During the compensation phase, the ISO0 and ISO1 signals and the AAGTEQ and AABLEQ signals may be set to respective inactive state to disable the transistors 751, 752, 718 and 719. The AABLCP signal may remain in an active state to enable the transistors 331 and 332 to couple the nodes 714 and 715 to the gut nodes 717 and 716, respectively. Additionally, the drain and the gate of the transistor 712 may be coupled and the drain and the gate of the transistor 713 may be coupled. At the end of the threshold voltage compensation phage, the AABLCP signal may transition to an inactive state, which disables the transistors 731 and 732 and decouples the nodes 714 and 715 from the gut nodes 717 and 716, respectively.

During the gut equalize phase, the gut nodes 717 and 716 may be decoupled from the digit lines DL 720 and/DL 721 and may be coupled to each other to equalize voltages between the gut nodes 716, 717 to the VPCH voltage. During this phase, the AAGTEQ and AABLEQ signals may transition to an active state. While the AABLCP signal is set to the inactive state, the transistors 732 and 731 may decouple the nodes 714 and 715 from the gut nodes 717 and 716. While the equilibrating signals AAGTEQ and AABLEQ are set to the active state, the transistors 718 and 719 may couple the VPCH voltage from the global power bus 750 to the gut nodes 716, 717. While the ISO0 and ISO1 signals are set to the inactive state, the isolation transistors 751 and 752 may decouple the gut nodes 717 and 716 from the digit lines DL 720 and/DL 721. After the to the gut nodes 716 and 717 are precharged to the VPCH voltage, the AAGTEQ and AABLEQ signals may be set to inactive states to disable the transistors 718 and 719. Also during the gut equalization phase, a wordline WL associated with the sense operation may be set to an active state. In some other examples, the wordline WL may be activated during the threshold voltage compensation phase.

During the sense phase, the VtC sense amplifier 700 may sense a data state of memory cell coupled to the digit line DL 720 or/DL 721. Initially, the ISO0 and ISO1 isolation signals may be set to an active state, followed by the ACT signal and the RNL signal being activated and set to the logic high level (e.g., the VARY voltage) and the logic low level (e.g., the GND voltage), respectively. Responsive to the ISO0 and ISO1 isolation signals transitioning to the active state, the ISO transistor 751 may couple the digit line DL 720 to the gut node 716 and the ISO transistor 752 may couple the digit line/DL 721 to the gut node 717. During the sense phase, sense and amplify operations are then performed with the threshold voltage compensation voltage to balance the responses of the second type of transistors 712 and 713. For example, in response to a memory cell (e.g., one of the memory cells 240(0)-(N) or memory cells 241(0)-(N) of FIG. 2) being coupled to a digit line DL 720 or/DL 721 through its respective access device, a voltage difference is created between the digit lines DL 720 and/DL 721 (e.g., via the guts nodes 716 and 717). The voltage difference is sensed by the second type of transistors 712, 713 as the sources of the second type of transistors 712, 713 begin to be pulled to ground through fully activated RNL signal, and one of the second type of transistors 712, 713 with a gate coupled to the digit line DL 720 or/DL 721 with the slightly higher voltage begins conducting. When a memory cell coupled to the gut node 716 through the digit line DL 720 stores a high data state, for example, the transistor 713 may begin conducting. Additionally, the other transistor 712 may become less conductive as the voltage of the gut node 717 with the slightly lower voltage decreases through the conducting transistor 713. Thus, the slightly higher and lower voltages are amplified to logic high and logic low voltages while the isolation signals ISO0 and ISO1 in the active state.

Because the isolation signals ISO0 and ISO1 were set active to couple the gut nodes 716, 717 to the respective digit lines DL 720 and/DL 721 prior to activating sense amplifier (e.g., setting the ACT signal and the RNL signal active), the gut nodes 716, 717 (e.g., and digit lines DL 720 and/DL 721) may be steadily driven to the ACT and RNL voltages, respectively.

After the data state of the memory cell is sensed, and the sense nodes 714, 715 are each pulled to a respective one of the ACT signal and RNL signal voltages, a read may be performed in response to a READ command. For example, the CS signal may be activated (e.g., in response to the READ command), the digit lines DL 720 and/DL 721 (e.g., at sense nodes 714 and 715) may be coupled to the LIO nodes (LIOT and LIOB) and the data output may be provided to the LIO nodes. Thus, the data may be read out from the LIO nodes. After a read operation is completed, the CS signal may be set to an inactive state. The process may start over for a subsequent sensing operation.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
 a first memory array mat comprising a plurality of access line segments formed in a first direction, wherein an access line segment of the plurality of access line segments is coupled to a first count of rows of memory cells;
 a second memory array mat formed adjacent an edge of the first memory array mat, the second memory array mat comprising:
  a first plurality of access line segment pairs formed in the first direction with each pair of the first plurality of access line segment pairs separated by a respective space, wherein an access line segment of a pair of the first plurality of access line segment pairs is coupled to a second count of rows of memory cells;
  a second plurality of access line segment pairs formed in the first direction and interleaved with the first plurality of access line segment pairs with each pair of the second plurality of access line segment pairs separated by a respective space, wherein an access line segment of a pair of the second plurality of access line segment pairs is coupled to a second count of rows of memory cells; and
  a plurality of access line jumpers, wherein a access line jumper of the plurality of access line jumpers is configured to electrically couple a first access line segment of a pair of the second plurality of access line segment pairs with a second access line segment of the pair of the second plurality of access line segment pairs across the respective space to form a respective combined access line segment;
 a first sense amplifier bank extending between the first memory array mat and the second memory array mat in a second direction perpendicular to the first direction, wherein the first sense amplifier bank includes a sense amplifier coupled to one of the plurality of access line segments and to the respective combined access line segment of one of the pairs of the second plurality of access line segments; and a second sense amplifier bank extending in the second direction along the respective space formed between pairs of the first and second pluralities of access line segment pairs; wherein the second sense amplifier bank includes a sense amplifier coupled to a first access line segment and a second access line segment of a pair of the first plurality of access line segment pairs.

2. The apparatus of claim 1, wherein the first count of rows of memory cells is greater than the second count of rows of memory cells.

3. The apparatus of claim 1, wherein the first count of rows of memory cells is double the second count of rows of memory cells.

4. The apparatus of claim 1, wherein the sense amplifier of the first sense amplifier bank is schematically similar to the sense amplifier of the second sense amplifier bank.

5. The apparatus of claim 1, wherein the sense amplifier of the first sense amplifier bank is schematically different than the sense amplifier of the second sense amplifier bank.

6. The apparatus of claim 1, wherein the sense amplifier of the first sense amplifier bank includes threshold voltage compensation circuitry.

7. The apparatus of claim 1, wherein the access line jumper of the plurality of access line jumpers includes a portion formed in a first metal layer different than a second metal layer used to form the first and second pluralities of access line pairs.

8. The apparatus of claim 7, wherein the access line jumper of the plurality of access line jumpers includes a via that extends vertically from the first metal layer to the second metal layer portion of the access line jumper.

9. The apparatus of claim 1, wherein the second memory array mat is an edge memory array mat.

10. The apparatus of claim 1, further comprising:
a third memory array mat formed adjacent a second edge of the first memory array mat opposite the second memory array mat, the third memory array mat comprising:
a third plurality of access line segment pairs formed in the first direction with each pair of the third plurality of access line segment pairs separated by respective space, wherein an access line segment of a pair of the third plurality of access line segment pairs is coupled to a second count of rows of memory cells;
a fourth plurality of access line segment pairs formed in the first direction and interleaved with the third plurality of access line segment pairs with each pair of the fourth plurality of access line segment pairs separated by respective space, wherein an access line segment of a pair of the fourth plurality of access line segment pairs is coupled to a second count of rows of memory cells; and
a second plurality of access line jumpers, wherein a access line jumper of the second plurality of access line jumpers is configured to electrically couple a first access line segment of a pair of the fourth plurality of access line segment pairs with a second access line segment of the pair of the fourth plurality of access line segment pairs across the respective space to form a respective combined access line segment; and a third sense amplifier bank extending in the second direction along the respective space formed between pairs of the third and fourth pluralities of access line segment pairs; wherein the third sense amplifier bank includes a sense amplifier coupled to a first access line segment and a second access line segment of a pair of the third plurality of access line segment pairs.

11. The apparatus of claim 10, further comprising a fourth sense amplifier bank extending between the first memory array mat and the third memory array mat in the second direction, wherein the fourth sense amplifier bank includes a sense amplifier coupled to one of the plurality of access line segments and to the respective combined access line segment of one of the pairs of the fourth plurality of access line segments.

12. An apparatus comprising:
an edge memory array mat comprising:
a first pair of access line segments separated by a first space, wherein an access line segment of the first pair of access line segments is coupled to a count of rows of memory cells, wherein each of the first pair of access line segments are coupled to a first sense amplifier of a first sense amplifier bank;
a second pair of access line segments separated by a second space, wherein the first space is aligned with the first space in a direction perpendicular to the first and second access line pairs, wherein an access line segment of the second pair of access line segments pairs is coupled to the count of rows of memory cells; and
an access line jumper configured to electrically couple a first access line segment of the second pair of access line segments to a second access line segment of the second pair of access line segments across the respective space to form a combined access line segment, wherein the combined access line segment is coupled to a second sense amplifier of a second sense amplifier bank formed between the edge memory array mat and an inner memory array mat.

13. The apparatus of claim 12, further comprising the first and second sense amplifier banks.

14. The apparatus of claim 13, wherein the first sense amplifier is schematically similar to the second sense amplifier.

15. The apparatus of claim 13, wherein the first sense amplifier is schematically different than the second sense amplifier.

16. The apparatus of claim 1, wherein the second sense amplifier includes threshold voltage compensation circuitry.

17. The apparatus of claim 12, further comprising the first sense amplifier bank extending in the direction perpendicular to the first and second access line pairs, wherein the first sense amplifier is positioned in the first space.

18. The apparatus of claim 12, wherein the access line jumper includes a portion formed in a first metal layer different than a second metal layer used to form the first and second pairs of access line segments.

19. A method comprising:
forming an edge memory array mat of a memory array by:
forming a plurality of access line segment pairs with each of the plurality of access line segment pairs separated at a common region;
forming a bank of sense amplifiers extending along the common region perpendicular to the sense amplifiers with respective sense amplifiers coupled to odd pairs of the plurality of access line segment pairs;

forming a plurality of access line jumpers configured to extend across the common region at a different level than the bank of sense amplifiers, wherein each of the plurality of access line jumpers is configured to electrically couple a respective even pair of the plurality of access line segment pairs together across the common region to form a combined access line; and forming a second bank of sense amplifiers along an edge of the edge memory array mat with a second sense amplifier configured to couple to the combined access line segment and to an access line segment of an inner memory array mat.

20. The method of claim 19, further comprising:

forming the plurality of access line segment pairs using a first metal layer; and forming a portion of the access line jumper using a second metal layer.

21. The method of claim 19, further comprising forming vias to extend from the first metal layer to the second metal layer for each of the plurality of access line jumpers.

* * * * *